US010367464B2

(12) United States Patent
Salle et al.

(10) Patent No.: US 10,367,464 B2
(45) Date of Patent: Jul. 30, 2019

(54) DIGITAL SYNTHESIZER, COMMUNICATION UNIT AND METHOD THEREFOR

(71) Applicant: NXP USA, Inc., Austin, TX (US)

(72) Inventors: Didier Salle, Toulouse (FR); Olivier Vincent Doare, La Salvetat St Gilles (FR); Birama Goumballa, Larra (FR); Cristian Pavao Moreira, Frouzins (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/645,112

(22) Filed: Jul. 10, 2017

(65) Prior Publication Data

US 2018/0123537 A1    May 3, 2018

(30) Foreign Application Priority Data

Oct. 27, 2016  (EP) .................................... 16306409

(51) Int. Cl.
$H03L\ 7/00$ (2006.01)
$H03G\ 3/00$ (2006.01)
$H03L\ 7/099$ (2006.01)
$G01S\ 13/34$ (2006.01)
$H03C\ 3/09$ (2006.01)
(Continued)

(52) U.S. Cl.
CPC ........... $H03G\ 3/002$ (2013.01); $G01S\ 13/343$ (2013.01); $H03C\ 3/0908$ (2013.01); $H03L\ 7/08$ (2013.01);
(Continued)

(58) Field of Classification Search
CPC ............................ H03G 3/002; H03L 2207/50
See application file for complete search history.

(56) References Cited

U.S. PATENT DOCUMENTS 6,851,493 B2 * 2/2005 Staszewski ........... H03L 7/1806
175/376
7,145,399 B2 * 12/2006 Staszewski ............. H03L 7/093
331/17
(Continued)

FOREIGN PATENT DOCUMENTS

EP    1217745 A2    6/2002
EP    1217745 A3    11/2004

OTHER PUBLICATIONS

Lou et al., "An Ultra-wideband Low-power ADPLL Chirp Synthesizer with Adaptive Loop Bandwidth in 65nm CMOS," 2016 IEEE Radio Frequency Integrated Circuits Symposium, 4 pages.

Primary Examiner — Thomas J. Hiltunen

(57) ABSTRACT

A digital synthesizer is described that comprises: a ramp generator configured to generate a signal of frequency control words, FCW, that describes a desired frequency modulated continuous wave; a digitally controlled oscillator, DCO configured to receive the FCW signal; a feedback loop; and a phase comparator coupled to the ramp generator and configured to compare a phase of the FCW output from the ramp generator and a signal fed back from the DCO via the feedback loop and output a N-bit oscillator control signal. The digital synthesizer comprises a gain circuit coupled to a multiplier located between the ramp generator and the DCO and configured to apply at least one gain from a plurality of selectable gains to the N-bit oscillator control signal that set a selectable loop gain of the digital synthesizer and thereby set a selectable loop bandwidth; and
calculate and apply a gain offset dependent upon the selected gain that is adapted when the selected gain is changed.

18 Claims, 5 Drawing Sheets

(51) Int. Cl.
    *H03L 7/08*     (2006.01)
    *H03L 7/093*     (2006.01)
    *H03L 7/16*     (2006.01)
    *H03L 7/091*     (2006.01)
    *H03L 7/107*     (2006.01)

(52) U.S. Cl.
    CPC ............ *H03L 7/093* (2013.01); *H03L 7/0992* (2013.01); *H03L 7/16* (2013.01); *G01S 13/34* (2013.01); *H03L 7/091* (2013.01); *H03L 7/1075* (2013.01); *H03L 2207/50* (2013.01)

(56) References Cited

U.S. PATENT DOCUMENTS

| | | | |
|---|---|---|---|
| 7,292,618 B2 | 11/2007 | Tal et al. | |
| 7,466,207 B2 | 12/2008 | Staszewski et al. | |
| 7,498,890 B2 * | 3/2009 | Wallberg | H03L 7/093 327/156 |
| 9,893,876 B2 * | 2/2018 | Moehlmann | H04L 7/0331 |
| 2003/0235262 A1 * | 12/2003 | Staszewski | H03L 7/087 375/376 |
| 2007/0066268 A1 * | 3/2007 | Simic | H04B 1/26 455/318 |
| 2007/0085622 A1 | 4/2007 | Wallberg et al. | |
| 2008/0068236 A1 * | 3/2008 | Sheba | G04F 10/005 341/118 |
| 2009/0052508 A1 * | 2/2009 | Takahashi | H03L 7/085 375/219 |
| 2012/0319889 A1 * | 12/2012 | Kobayashi | G01S 7/4008 342/118 |
| 2013/0328604 A1 * | 12/2013 | Matsuda | H03L 7/107 327/159 |
| 2014/0077849 A1 * | 3/2014 | Chen | H03L 7/08 327/156 |

\* cited by examiner

US 10,367,464 B2

DIGITAL SYNTHESIZER, COMMUNICATION UNIT AND METHOD THEREFOR

FIELD OF THE INVENTION

The field of the invention relates to a digital synthesizer having a digitally controlled oscillator in a digital phase locked loop circuit (DPLL), a communication unit and a method therefor. In particular, the field relates to an all-digital PLL (ADPLL) for a frequency modulated continuous wave (FMCW) radar device in order to provide a fast reset time.

BACKGROUND OF THE INVENTION

In many present day wireless communication applications, a digital synthesizer is used and often implemented by way of a digital phase locked loop (DPLL) that is used to control a digitally controlled oscillator (DCO) to generate (often referred to as 'synthesize') an output radio frequency (local oscillator) signal. Such digital synthesizers provide the benefit of simplifying the integration of the synthesizer circuitry within large scale integrated digital circuit devices, as compared with equivalent analogue synthesizers, thereby reducing size, cost, power consumption and design complexity. Furthermore, DPLLs intrinsically present lower phase noise than their analogue counterparts.

All-digital phase locked loops (ADPLLs) can be used as a frequency synthesizer in radio frequency circuits to create a stable local oscillator for transmitters or receivers, due to their low power consumption and high integration level. They can also be used to generate the frequency-modulated continuous wave (FMCW) waveforms required by a radar transmitter.

Modern FMCW radar systems require fast modulation ramps (with ramp-up times from 10 us to 100 us), but only process radar signals during ramp-up periods. A modulation ramp is a linear frequency-modulated continuous-wave signal with frequency varying over time. The modulation occurs during ramp up and ramp down with various slopes to allow processing of the received signal in order to extract range and speed information of targets. As the ramp-up time (from a start frequency to a stop frequency) is used for radar processing, the reset time, namely the time taken for the ADPLL to reset to the start frequency, is an unused (and therefore wasted) time. Hence, the inventors have recognized and appreciated that it is important in the design of ADPLL circuits, particularly ADPLL circuits for FMCW radar applications, that this reset time is kept as short as possible in order to speed up the time between successive ramps. This reset time is limited by the PLL bandwidth, which cannot be set too wide in order to ensure good phase-noise. This is a similar performance limitation as found in analog and other digital PLLs.

U.S. Pat. No. 7,498,890 B2 describes a continuous reversible gear shifting mechanism for an ADPLL. However, the algorithm in U.S. Pat. No. 7,498,890 B2 uses gear-shifting inside a loop filter in an ADPLL, and is only notably used in order to speed up a PLL lock time. Thus, and notably, the reversible gear shifting mechanism is switched off after locking, as it creates DCO frequency jumps at each gear shift, which is undesirable in most applications. A further disadvantage of the continuous reversible gear shifting mechanism of U.S. Pat. No. 7,466,207 B2 is that it is only able to support decreasing loop gains, i.e. from a large gain to a small gain.

Accordingly, it is important to generate modulation signals for FMCW with very short (i.e. wasted) reset time, thereby supporting a faster refresh rate (e.g. successive resets to the start frequency) of the radar device or radar-supported device.

SUMMARY OF THE INVENTION

The present invention provides a digital synthesizer, a communication unit, such as a radar device, and a method therefor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
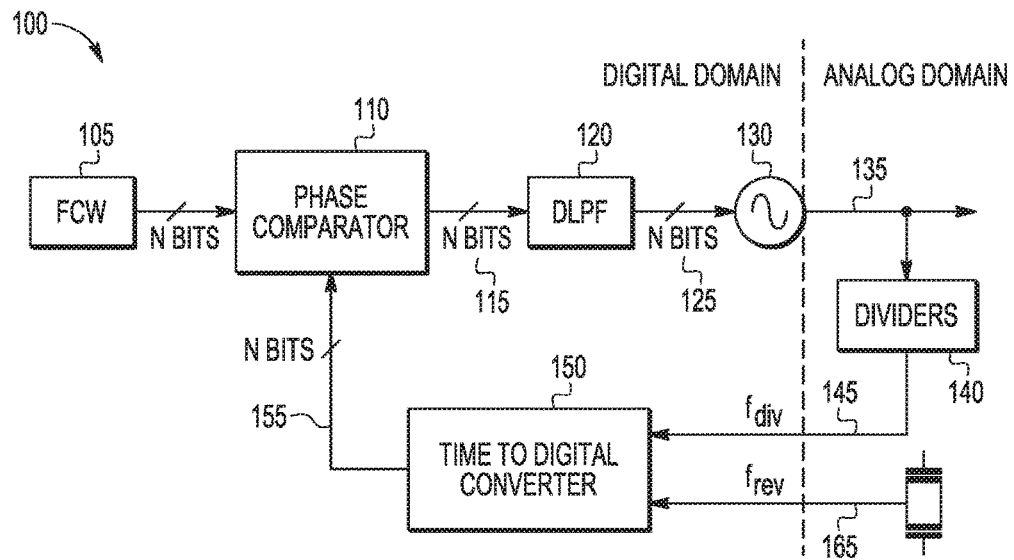
FIG. 1 illustrates a conventional digital phase locked loop design.

In accordance with some example embodiments of the present invention, there is provided a digital synthesizer and a method of generating a digital oscillator signal. In examples of the invention, a digital synthesizer includes a modulation generator that generates not only frequency control words (FCW) that describe the wanted FMCW ramps, but concurrently generates a gear-shift signal. The gear-shift signal is configured to select a gain, from multiple selectable gains, to be applied to the FCW signal. The setting and selecting of gains applied to the FCW signal affects the loop bandwidth.

Although examples of the invention are described with respect to digital PLLs, it is envisaged that such concepts may be employed in any system that transmits (modulated) information, for example systems that sometimes need fast rise/fall time of the modulation, and sometimes low-phase noise slow modulation can benefit from the concepts described herein.

In some examples, the loop bandwidth may be changed at specific points in time, controlled, say, by the modulation generator, and may be effected without any PLL frequency jump. Examples of the invention support both increasing and decreasing gains, and therefore increasing and decreasing loop bandwidths. This is achieved in some examples by employing memory of two previous calculated offsets, as illustrated further in FIGS. 4 to 6. In this manner, the selection of gains from multiple selectable gains that are applied to the modulation FMCW signals, and the consequent impact on loop bandwidth, create a reduced (e.g. wasted) reset time. Advantageously, the reduced reset time may be used to implement a faster refresh rate of the radar system or radar device. This may be achieved by changing the gain from G1 (low) to G2 (high), which increases the PLL open-loop gain and thus bandwidth and a speed in response to a perturbation. In some examples, the loop bandwidth is changed by the means of loop gains (and in some instances an additional loop filter setting) and may be changed dynamically during a generation of FMCW radar signals, i.e. when the PLL is locked.

In some examples, the loop bandwidth of the ADPLL is changed by changing gains employed in a gear-shifting circuit, for example selecting between different gains output by one or more gain circuits. In some examples, the loop bandwidth of the ADPLL may be changed additionally by adapting filter frequency responses (e.g. infinite impulse response (IIR)) inside the loop-filter.

Known ADPLLs have rarely been used in FMCW radar systems and devices, as yet, due to the extremely demanding phase-noise performances that are required in such systems and devices, and also very demanding level of spurious signals that are needed, which are extremely difficult to attain with an ADPLL. The known technique disclosed in U.S. Pat. No. 7,498,890 B2 describes a continuous reversible gear shifting mechanism for an ADPLL that assists the speed in achieving a PLL lock, but is not acceptable for reducing a FMCW radar reset period, because it does not support a practical switching back and forth between fast and slow modulation.

FIG. 1 illustrates a conventional digital phase locked loop (DPLL) 100. An N-bit digital FCW 105 is provided to a phase comparator 110, which compares an N-bit digital feedback signal 155 to the FCW 105, and outputs an N-bit oscillator control signal 115 based on the comparison of the digital feedback signal 155 to the FCW 105. A digital low pass filter 120 filters the N-bit oscillator control signal 115, and outputs a filtered N-bit oscillator control signal 125, which is provided to a digitally controlled oscillator (DCO) 130. The DCO 130 outputs a frequency signal 135 based on the filtered N-bit oscillator control signal 125. A feedback path of the DPLL 100 consists of a divider 140 that divides the output frequency signal 135 to generate a frequency-divided signal 145, which is provided to a time-to-digital converter (TDC) 150. The TDC 150 also receives a reference frequency signal 165, which is used to sample the frequency-divided signal 145. The TDC 150 outputs the N-bit digital feedback signal 155 based on a measured time interval between the frequency-divided signal 145 and the reference frequency signal 165.

Figure 2:
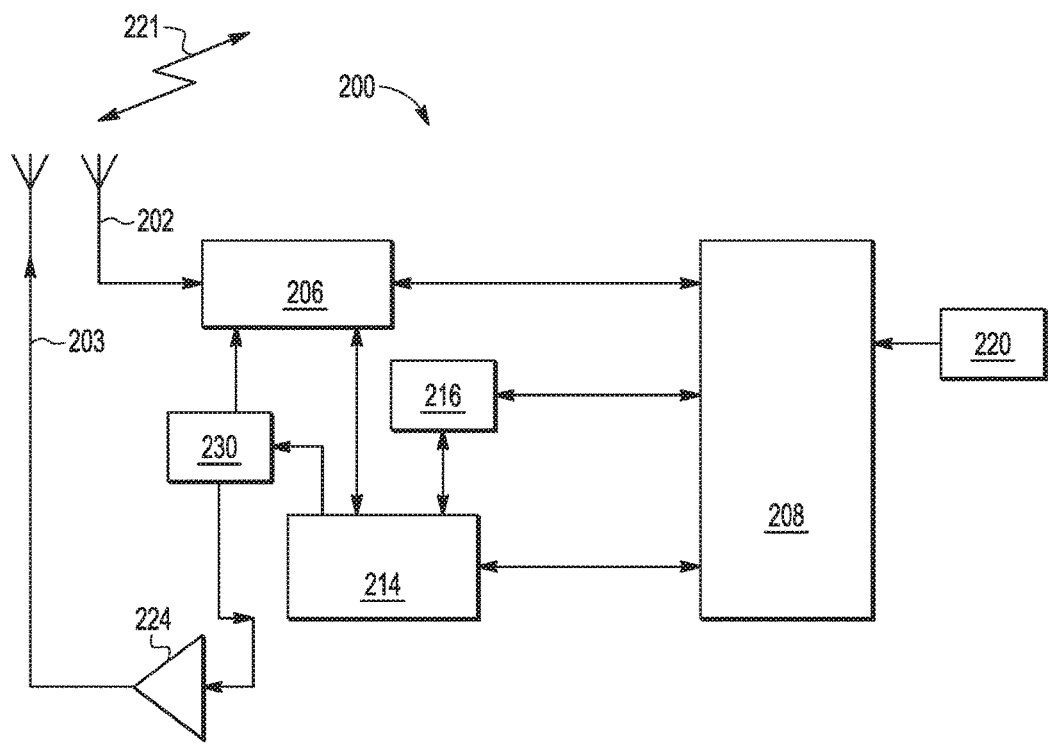
FIG. 2 illustrates a simplified block diagram of a radar device, adapted in accordance with examples of the invention.

Referring to FIG. 2, a block diagram of a wireless communication unit is shown, adapted in accordance with some examples of the invention. Purely for explanatory purposes, the wireless communication unit is described in terms of a radar device 200 operating at millimeter (MMW) frequencies. The radar device 200 contains one or several antennas 202 for receiving radar signals 221, and one or several antennas 203 for transmitting radar signals, with one shown for each for simplicity reasons only. The number of antennas 202, 203 used may depend on the number of radar receiver and transmitter channels that are implemented in a given radar device. One or more receiver chains, as known in the art, include receiver front-end circuitry 206, effectively providing reception, frequency conversion, filtering and intermediate or base-band amplification, and finally an analog-to-digital conversion. In some examples, a number of such circuits or components may reside in signal processing module 208, dependent upon the specific selected architecture. The receiver front-end circuitry 206 is coupled to the signal processing module 208 (generally realized by a digital signal processor (DSP)). A skilled artisan will appreciate that the level of integration of receiver circuits or components may be, in some instances, implementation-dependent.

The controller 214 maintains overall operational control of the radar device 200, and in some examples may comprise time-based digital functions (not shown) to control the timing of operations (e.g. transmission or reception of time-dependent signals, FMCW modulation generation, etc.) within the radar device 200. The controller 214 is also coupled to the receiver front-end circuitry 206 and the signal processing module 208. In some examples, the controller 214 is also coupled to a memory device 216 that selectively stores operating regimes, such as decoding/encoding functions, and the like.

As regards the transmit chain, this essentially comprises a power amplifier (PA) 224 coupled to the transmitter's one or several antennas 203, antenna array, or plurality of antennas. In radar device 200, radar transceiver topology is different from traditional wireless communication architectures (e.g. Bluetooth™, WiFi™, etc.), as modulation occurs within a phase locked loop (PLL) (typically via a fractional-N divider), and is applied directly to the PA 224. Therefore, in some examples, the receiver front-end circuitry 206 and transmitter PA 224 are coupled to frequency generation circuit 230 arranged to provide local oscillator signals. The generated local oscillator signals are thus modulated directly to generate transmit radar signals, and also used to down-convert received modulated radar signals to a final intermediate or baseband frequency or digital signal for processing in a receive operation.

Figure 3:
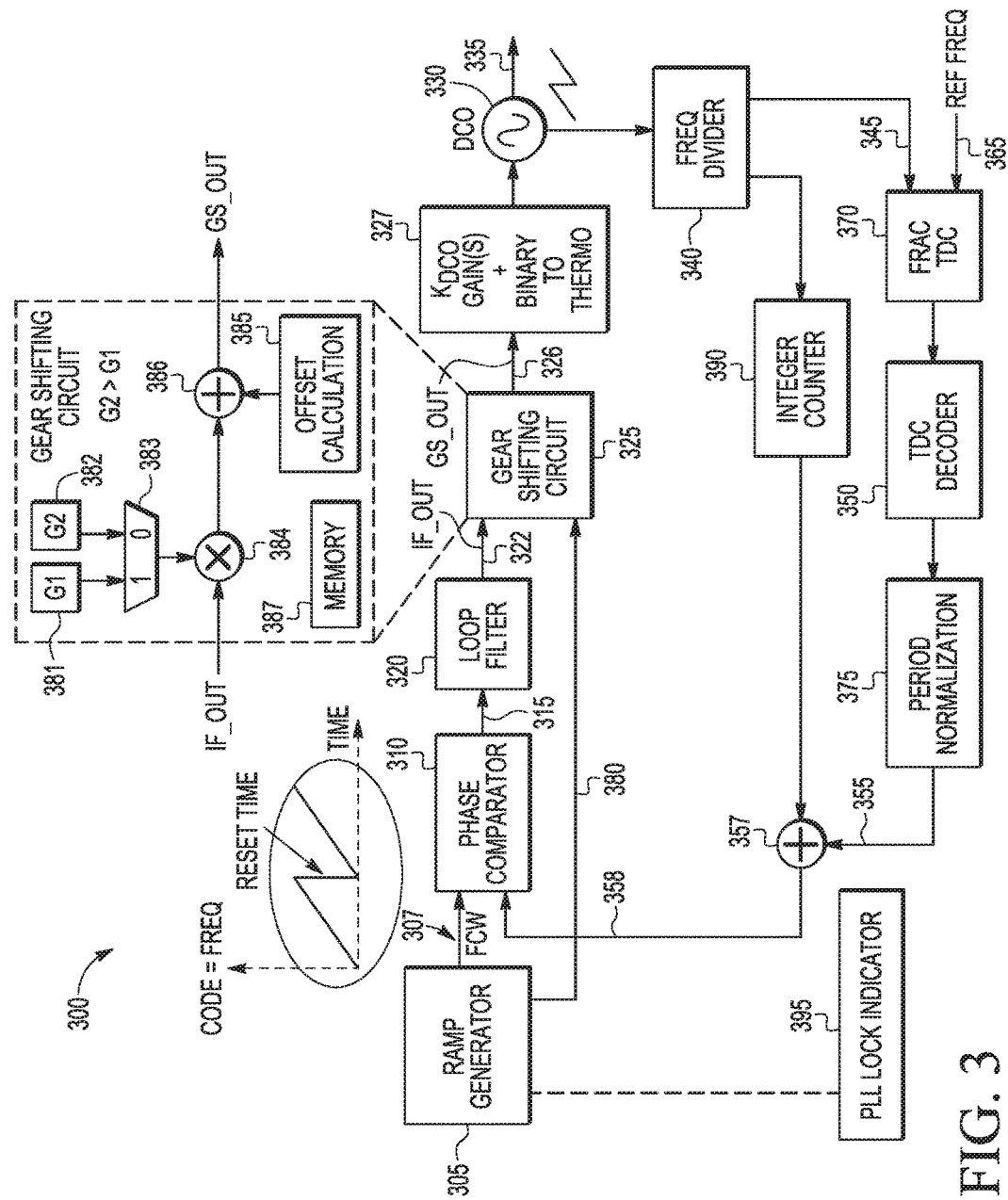
FIG. 3 illustrates a simplified circuit diagram of a first example of a digitally controlled oscillator in accordance with examples of the invention.

In accordance with examples of the invention, frequency generation circuit 230 includes a digital synthesizer comprising a digitally controlled oscillator, DCO; a feedback loop; a ramp generator configured to generate a signal of frequency control words, FCW, that describes a desired frequency modulated continuous wave; and a phase comparator configured to compare a phase of the FCW output from the ramp generator and a signal fed back from the DCO via the feedback loop and output a N-bit oscillator control signal, as described with reference to FIG. 3. The digital synthesizer includes a gain circuit coupled to a multiplier located between the ramp generator and the DCO and configured to apply a selected gain to the N-bit oscillator control signal, thereby changing a loop gain and the loop bandwidth.

In FIG. 2, a single signal processor may be used to implement a processing of receive signals. Clearly, the various components within the radar device 200 can be realized in discrete or integrated component form, with an ultimate structure therefore being an application-specific or design selection.

A skilled artisan will appreciate that the level of integration of circuits or components may be, in some instances, implementation-dependent.

FIG. 3 illustrates a simplified block diagram of a first example of a digital synthesizer, and more specifically a digital phase locked loop (DPLL) 300 that includes a digitally controlled oscillator (DCO) 330, in accordance with examples of the invention. In some examples, the DPLL may form part of the frequency generation circuit 230 of FIG. 2. In some examples, a modulation generator, which in the illustrated example is a ramp generator 305, is configured to generate not only frequency control word (FCW) signals 307 that describe the wanted frequency modulated continuous waveform (FMCW) ramps, but additionally a gain control/selection signal 380 to select a gain to be applied to the FCW signal 307.

Thus, in the illustrated example, a ramp generator 305, generates an N-bit digital FCW signals 307 and provides the N-bit digital FCW signals 307 to a phase comparator 310, which compares an N-bit digital feedback signal 355 to the FCW signals 307, and outputs an N-bit oscillator control signal 315 based on the comparison of the digital feedback signal 358 to the FCW signals 307. A digital low pass filter 320 filters the output N-bit oscillator control signal 315, and outputs a filtered N-bit oscillator control signal to a gear shifting circuit 325.

At the same time that the ramp generator 305 generates N-bit digital FCW signal 307, it also generates the gain control/selection signal 380 that is applied to the gear shifting circuit 325. Gear shifting circuit 325 includes first and second selectable gain circuits 381, 382. In one example, first and second selectable gain circuits 381, 382 provide input gain signals to a multiplexer 383, which is controlled to select one of the gain circuits to apply a gain to a multiplier 384 in response to the gain control/selection signal 380. In this manner, the filtered N-bit oscillator control signal (identified as an intermediate frequency (IF_out) signal), which is input to the multiplier 384, is multiplied by the selected gain, i.e. the gain provided by either first or second selectable gain circuits 381, 382. The gear shifting circuit 325 includes a summing junction that combines an output signal from the multiplier 384 with an offset value that is determined by an offset calculation circuit 385, one example of which is described with respect to FIG. 6.

The gear shifting circuit 325 then outputs the gear shift output signal (gs_out) 326 to the DCO 330 via a further gain circuit 327, which in this example is identified as a KDCO gain(s)+binary to thermometer gain circuit, where KDCO is the DCO gain. In essence, this results in a multiplication of a fixed gain (Kdco) that comes from a calibration of the DCO, in order to track the DCO gain. Thereafter, a decoder converts binary code into thermometer code in order to control the DCO, as the DCO needs this type of data format.

The DCO 330 outputs a frequency signal 335 based on the filtered oscillator control signal output from the gear shifting circuit 325. A feedback path of the DPLL 300 consists of a frequency divider 340 that divides the output frequency signal 335 to generate a frequency-divided signal 345, which is provided to a fractional time-to-digital converter (TDC) 370. The fractional TDC 370 also receives a reference frequency signal 365 that is used to sample the frequency-divided signal 345. The fractional TDC 370 routes the digital feedback signal to a TDC decoder 350 that decodes the digital feedback signal and outputs the decoded digital feedback signal to a period normalisation circuit 375 configured to provide the result of the fractional TDC measurement normalized to a period of the DCO frequency-divided signal 345.

The fractional TDC result, once normalized to the DCO divided-down period 355, is input to an adder 357, where it is added with an output from an integer counter 390 that also receives the frequency-divided signal 345. The adder 357 outputs the digital signal 358, which consists of the integer and fractional ratio between the reference frequency and DCO frequency-divided signal 345 to the phase comparator 310.

In this example, the loop of the DPLL bandwidth is changed back and forth, from low bandwidth to high bandwidth, by adapting the gain provided by gear shifting circuit 325. In one example, the gain provided by gear shifting circuit 325 may be controlled by switching in/out the gains 381, 382 (G1<=>G2). In some examples, the loop filter 320 may include an infinite impulse response (IIR) filter, whose response may be adapted at specific points in time. In one example, the IIR response of the loop filter 320 may be controlled by the control signal 380 of the modulation generator 305, in order to speed up the modulation reset time. This may be achieved by adapting the IIR filter response, thereby increasing the PLL open-loop gain and, thus, bandwidth and a speed in response to a perturbation In some alternative examples, the gain control/selection signal 380 may be generated at the output of the loop filter 320 or after KDCO gain (before binary to thermo decoder) of further gain circuit 327, instead of by the ramp generator 305. In this example, the gain control/selection signal 380 may be generated from knowledge of the DCO control code that corresponds to the ramp frequencies. Such knowledge of DCO code vs frequency is process-voltage-temperature dependent, and as such cannot be known a priori, and in one example requires calibration and memory 387 to store the many variable values. However, the preferred and simplest solution is the one shown in FIG. 2 whereby the correlation between the modulation frequency and DCO control code is not needed.

Although the example in FIG. 3 illustrates the gear shifting circuit 325 being located after the loop filter, it is envisaged that, in other examples, the gear shifting circuit 325 may also be implemented inside the loop filter, for example to replace a 'proportional' part of the loop filter 320, where the output is 'proportional' to the input and provides a simple gain. In some examples, the gear-shifting block can also be implemented inside the loop filter on each filter response part, for example the proportional, the integral (where the output is proportional to the integral of the input) and the IIR part.

Thus, in this manner, any suitable circuit design where the gain may be selectively changed in the feedback loop can be used, including changing the PLL bandwidth, and thereby speed of response.

In one example, a PLL lock indicator circuit 395 determines when the PLL is in a frequency 'lock' mode and accordingly informs the ramp generator 305.

The PLL lock/un-locking indicator circuit 395 may be triggered if the ramp up or ramp down slope of the modulation is too fast for the PLL bandwidth. In this situation, the phase error accumulates and the PLL finally unlocks. This forces the modulation to stop to avoid transmitting to an undesired (possibly forbidden) frequency. Hence, with reference to the waveform of FIG. 5, this consequently limits the minimum achievable value of 't2−t1'.

Figure 4:
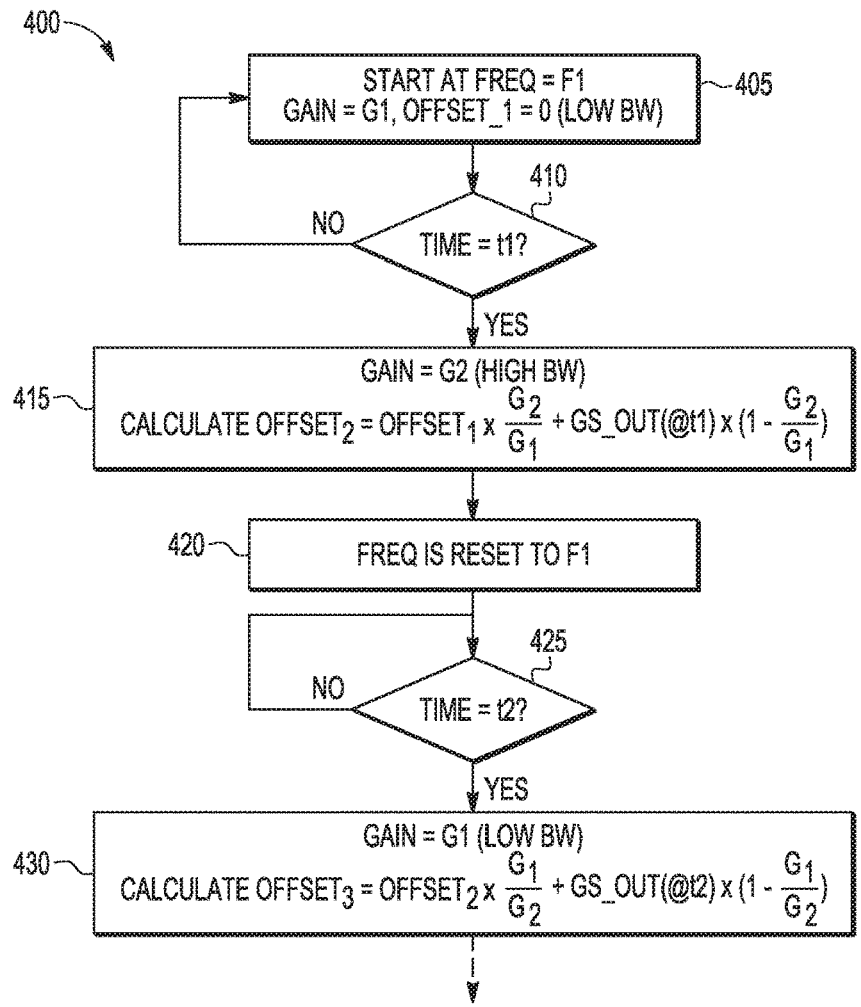
FIG. 4 illustrates a simplified flowchart of an example of a method of selecting and setting selectable gains in a digitally controlled oscillator to provide a fast reset time.

FIG. 4 illustrates a simplified flowchart 400 of an example of a method of selecting and setting selectable gains in a digitally controlled oscillator, for example in order to provide a fast reset time in accordance with some examples of the invention. At 405, the flowchart starts, with, say, the following initial settings: the initial frequency is set to, say, a minimum ramp frequency at Freq=F1, gain selected:

gain=G1, offset applied: offset_1=0 for example, for a low bandwidth mode of operation. At 410, a determination is made as to whether a first time period has expired, e.g. a timer or counter has reached t1. If the determination at 410 is that the first time period (t1) has not expired, the flowchart loops back to 405. If the determination at 410 is that the first time period (t1) has expired, the flowchart moves to 415, where a new gain is set/selected within the gear shift circuit 325 of FIG. 3, for example Gain=G2 (thereby transitioning to a high bandwidth). Furthermore, at 415, the offset is calculated, for example according to equation [1] below:

$$\text{calculate offset}_2 = \text{offset}_1 \times \frac{G_2}{G_1} + \text{gs\_out}(@t1) \times \left(1 - \frac{G_2}{G_1}\right) \quad [1]$$

At 420, the frequency is then reset to the start frequency F1. At 425, a determination is made as to whether a second time period (t2) has expired, e.g. whether timer or counter (such as timer 216 in FIG. 2 or integer counter 390 in FIG. 3) has reached t2. If the determination at 425 is that the second time period (t2) has not been reached or expired, the flowchart loops (i.e. back to 425). If the determination at 425 is that the second time period (t2) has been reached or expired, the flowchart moves to 430, where a new gain is set/selected within the gear shift circuit 325 of FIG. 3, for example Gain=G1 (thereby transitioning to a low bandwidth). Furthermore, at 430, the offset is re-calculated, for example according to equation [2] below:

$$\text{calculate offset}_3 = \text{offset}_2 \times \frac{G_1}{G_2} + \text{gs\_out}(@t2) \times \left(1 - \frac{G_1}{G_2}\right) \quad [2]$$

The flowchart then repeats.

In this manner, new calculations of offset values to be applied may be made using two sets of data and selecting between two gain settings that transitions between two loop bandwidths. By using the described algorithm and offset calculation of FIG. 4, an input code to the DCO has no jump when changing gain, as the frequency ramp has stopped when the gain is changed. Thus, the DCO frequency transition is also smooth due to the calculation and applying of gain offset values and the reset time is minimized. In this manner, reset time is minimized because when the gain is G2 (i.e. large), it also increases the PLL bandwidth, thereby making it faster to respond to changes in frequency.

Figure 6:
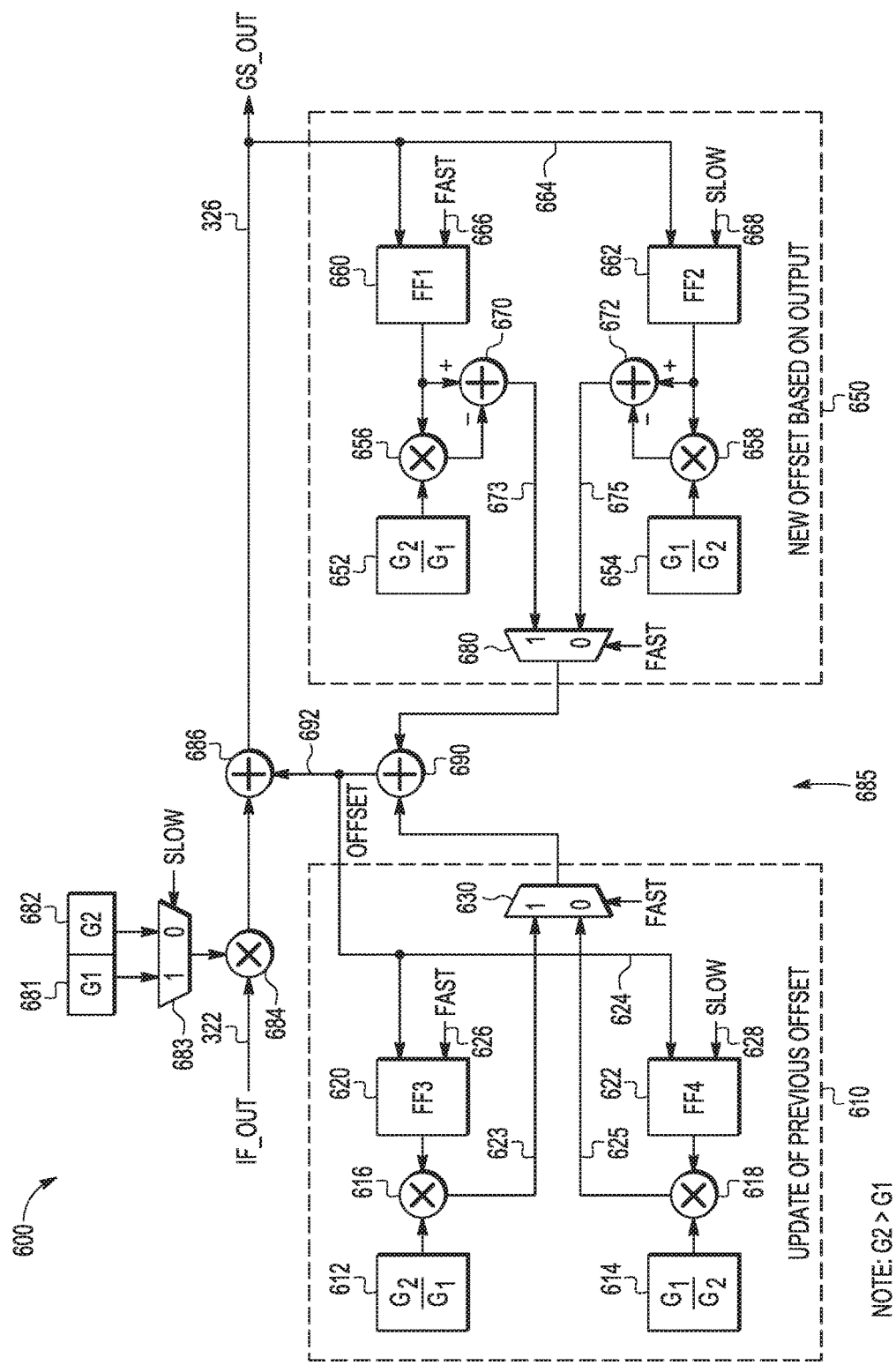
FIG. 6 illustrates a simplified circuit diagram of a first example of a gear shifting circuit of a digitally controlled oscillator with offset control, in accordance with examples of the invention.

In some examples, the output of the gear_shifting block (gs_out) may be stored into a memory 387, also shown as, say, FF1, FF2, FF3 and FF4 in FIG. 6. In such an example, a previous value of the offset may be employed.

In other examples, it is envisaged that the first time period (t1) may be configured to be the same as a Ramp_stop timing point, or shortly after. Similarly, the second time period (t2) may be configured to be the same as a Ramp_start timing point, or slightly before.

In some examples, it is envisaged that the gain may be configured to change by a factor of, say, 1.2 to 3, with a bandwidth traversing several hundreds of kHz.

Figure 5:
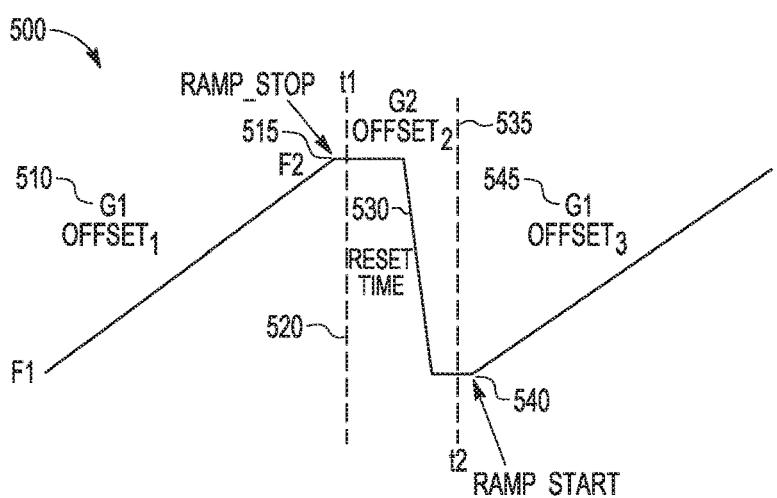
FIG. 5 illustrates an example ramp waveform with a reset period associated with the flowchart of FIG. 4.

FIG. 5 illustrates an example ramp waveform 500 associated with the flowchart of FIG. 4. The ramp modulation signal starts at a first (minimum, in this example) frequency F1, 505, with the gear-shifting circuit set to employ a first gain (G1) and a first offset value 510. The ramp modulation signal increases until it reaches a second (maximum, in this example) frequency F2, 515, when the modulation frequency ramp-up is stopped. The ramp modulation signal is stable at a first timing point t1 520. At this point, with the ramp modulation signal being stable, the gain in the gear-shifting circuit is reset during a reset time 530, leading to the ramp modulation signal being returned to the first frequency F1, 505. Thereafter, at a subsequent second time point t2 535, the gain is changed again to G1, and the ramp modulation signal starts to ramp up again from a ramp start point 540, with a new gain and offset calculation 545, as illustrated in FIG. 4.

In this example flowchart, the gains applied remain the same. However, the use of the same gains being applied is not sufficient, and the inventors have recognized and appreciated that the use of the offsets, and how they are calculated to avoid the jumps, for example as described in FIG. 4, enables the reset times to be minimized.

In examples of the invention, the gear shifting process of FIG. 4 operates the same, irrespective of whether it is performed inside or outside of the loop filter, such as loop filter 320 of FIG. 2.

Although, example ramp waveform 500 is illustrated with a ramp-up modulation, it is envisaged that a similar ramp-down waveform may be adopted, for example by reversing the gains used in the lock period and the reset time period. Thus, by using a memory of two previously calculated offsets, examples of the invention support both increasing and decreasing frequency ramps and gains and reversible high bandwidths and low bandwidths through appropriate control and timing of the gains that are used.

In FIG. 5, the regions where a flat frequency occurs are needed, i.e. between t1 and the reset time 530 commencing and again to t2. In some examples, these periods may be programmable dependent upon the use case of modulation timings. Some reasons to provide such flat frequency regions include letting the PLL frequency settle after a change, but also transmitting data between a micro controller unit (MCU) and radar transceiver chip in order to change various settings, or to transmit received data between radar transceiver and MCU to be processed by the MCU, etc.

FIG. 6 illustrates a simplified circuit diagram 600 of one example of a gear shifting circuit of a digitally controlled oscillator in accordance with examples of the invention. The simplified circuit diagram 600 illustrates one example circuit that is able to calculate dynamically the two offsets to be used after each jump, in order to make the jump smooth, using previous frequencies. Thus, a memory-based approach is used.

The gear shifting circuit includes, in this example, first and second selectable gain circuits 681, 682. In one example, first and second selectable gain circuits 681, 682 provide respective different input gains to a multiplexer 683, which selects one of the gain circuits to apply to a multiplier 684 in response to the control signal, e.g. gain control/selection signal 380 in FIG. 3. In some examples, the gains G1 and G2 may be programmed using a classical serial peripheral interface (SPI). In 'slow' mode, a first low gain 'G1' is used, whereas, in a 'fast' mode, high gain 'G2' is used. The gains are static. The fast/slow control signals are, for example, set by the gain control/selection signal 380 from the ramp generator 305 of FIG. 3.

The filtered N-bit oscillator control signal (identified as an intermediate frequency (IF_out) signal) 322, which is output from the loop filter, is input to the multiplier 684, is multiplied by the selected gain, i.e. the gain provided by either first or second selectable gain circuits 681, 682. The gear shifting circuit includes a summing junction that combines an output signal from the multiplier 684 with an offset value determined by an offset calculation circuit 685. An output (gs_out) 326 from the gain shifting circuit is input to the DCO.

The offset calculation circuit 685 includes two distinct circuits, a first circuit 610 that provides an update to adder 686 of a previous offset. The first circuit 610 extracts the offset signal 692 that is provided to adder 686, and inputs the extracted offset signal into third flip-flop (FF3) 620 and fourth flip-flop (FF4) 622.

The aim of the first circuit 610 is to update the previous value of offset that was used in the previous mode. Thus, when transitioning from 'slow mode' to 'fast mode', the offset value 692, just before the mode change, is stored in the third flip-flop (FF3) 620. The output from third flip-flop (FF3) 620 is clocked by a first 'fast mode' clock trigger. Similarly, when transitioning from 'fast mode' to 'slow mode', the offset value 692, just before the mode change, is stored in the fourth flip-flop (FF4) 622. The output from fourth flip-flop (FF4) 622 is clocked by a second 'slow mode' clock trigger accordingly.

The outputs from the third flip-flop (FF3) 620 and fourth flip-flop (FF4) 622 are input to respective multipliers 616, 618, where they are multiplied by respective different gain values 612, 614. In this example, the first gain value is representative of G2/G1, whereas the second gain value is representative of G1/G2. The multiplied outputs from the respective multipliers 616, 618 is input to a multiplexer 630 that selects the respective clocked gain-based offset signal to be applied to a summing junction 690.

In this example, multiplexer 630 uses a fast mode ('1') as a control input. This sends the top input line 623 to its output, which has a value FF3\*G2/G1, with FF3 containing the offset value just before the change from 'slow mode' to 'fast mode'. This remains the case (and the output from multiplexer 630 during the whole 'fast' mode operation. Alternatively, when operating in the 'slow' mode, the output of the multiplexer 630 is the bottom input 625 of the multiplexer 630, which has a value FF4\*G2/G1, with FF4 622 containing the offset value just before the change from 'fast mode' to 'slow mode'.

A second circuit 650 of the offset calculation circuit 685 generates a new offset value, based on the output (gs_out) 326 just before the change of mode. Thus, the new offset value is input to adder 686 based on the gear-shift output signal 326 of the gear-shift circuit 600. The second circuit 650 stores the new offset by storing the output signal gs_out in first and second flip-flops (FF1) 660, and (FF2) 662.

When transitioning from slow to fast mode, the output (gs_out) 326 is stored in first flip flop (FF1) 660 just before the mode change. When transitioning from fast to slow mode, the output (gs_out) 326 is stored in second flip flop (FF2) 662 just before the mode change. The outputs from first and second flip-flops 660, 662 are clocked by the first fast clock trigger and a second slow clock trigger accordingly. The outputs from the first and second flip-flops 660, 662 are input to respective multipliers 656, 658, where they are multiplied by respective different gain values 652, 654.

In this example, the first gain value is representative of G2/G1 and is applied to third multiplier 656, whereas the second gain value is representative of G1/G2 and is applied to fourth multiplier 658. The multiplied outputs from the respective multipliers 656, 658 are input to a respective summing junction 670, 672 where they are added to the outputs from the respective third and fourth flip flops 660, 662. The outputs from the respective summing junction 670, 672 are input to multiplexer 680 that selects the respective clocked gain-based offset signal to be applied to summing junction 690.

In this example, multiplexer 680 uses a fast mode ('1') as a control input. This sends the top input line 673 to its output, which has value gs_out\*(1−G2/G1), with gs_out being the stored value before the change from 'slow' to 'fast' mode. This remains the case and the output from multiplexer 680 stays the same during the whole 'fast' mode operation. Alternatively, when operating in the 'slow' mode, the output of the multiplexer 680 is the bottom input 675 of the multiplexer 680, which has value gs_out\*(1−G1/G2), which in this case is gs_out being the output value stored just before the mode is changed from 'fast mode' to 'slow mode'.

The output of both first circuit 610 and second circuit 650 are added together in summing junction 690 to form the current value of offset that is added to the input to have seamless frequency change.

Finally the offset calculated with the above equations, as further clarified in FIG. 4, ensures that when a change of mode from 'slow mode' to 'fast mode', or 'fast mode' to 'slow mode', happens, the gain changes. However, and advantageously, the instantaneous value of gs_out 326 remains unchanged.

As an example, let us assume that the gear shifting circuit is in a 'slow mode', where the gain being used is 'G1' 681. In this mode, irrespective of the values of If_out 322 and offset1 692:

$$Gs\_out1 = If\_out1 \times G1 + offset1 \quad [3]$$

Thereafter, if the mode is changed to 'fast mode', the first flip flop (FF1) 660 stores gs_out1 and the output of the multiplexer 680 becomes: gs_out1\*(1−G2/G1).

In the first circuit, the third flip flop (FF3) 620 stores offset1 so that the output of the multiplexer 630 is offset1\*G2/G1. Hence, the new offset 692 is:

$$gs\_out1*(1-G2/G1) + offset1*G2/G1 \quad [4]$$

If we assume that the input was unchanged, the new output becomes:

$$gs\_out2 = If\_out1*G2 + gs\_out1*(1-G2/G1) + offset1*G2/G1 \quad [5]$$

However, gs_out1 was If_out1\*G1+offset1. Therefore:

$$gs\_out2 = If\_out1*G2 + (If\_out1*G1 + offset1)*(1-G2/G1) + offset1*G2/G1 \quad [6]$$

and $$gs\_out2 = If\_out1*G2 + If\_out1*G1 - If\_out1*G2 + offset1 - offset1*G2/G1 + offset1*G2/G1 \quad [7]$$

Hence, gs_out2=If_out1\*G1+offset1, which is also equal to gs_out1, and therefore the output 326 remains unchanged.

The same operation can be verified when changing from 'fast mode' to 'slow mode'.

Examples of the invention, as illustrated in the simplified circuit diagram of FIG. 6, include a limited number of flip-flops and gate, whereas, in practice, the gates in FIG. 6 may be formed of many more flip-flops and groups of gates, as the digital information is made of several bits.

Figure 7:
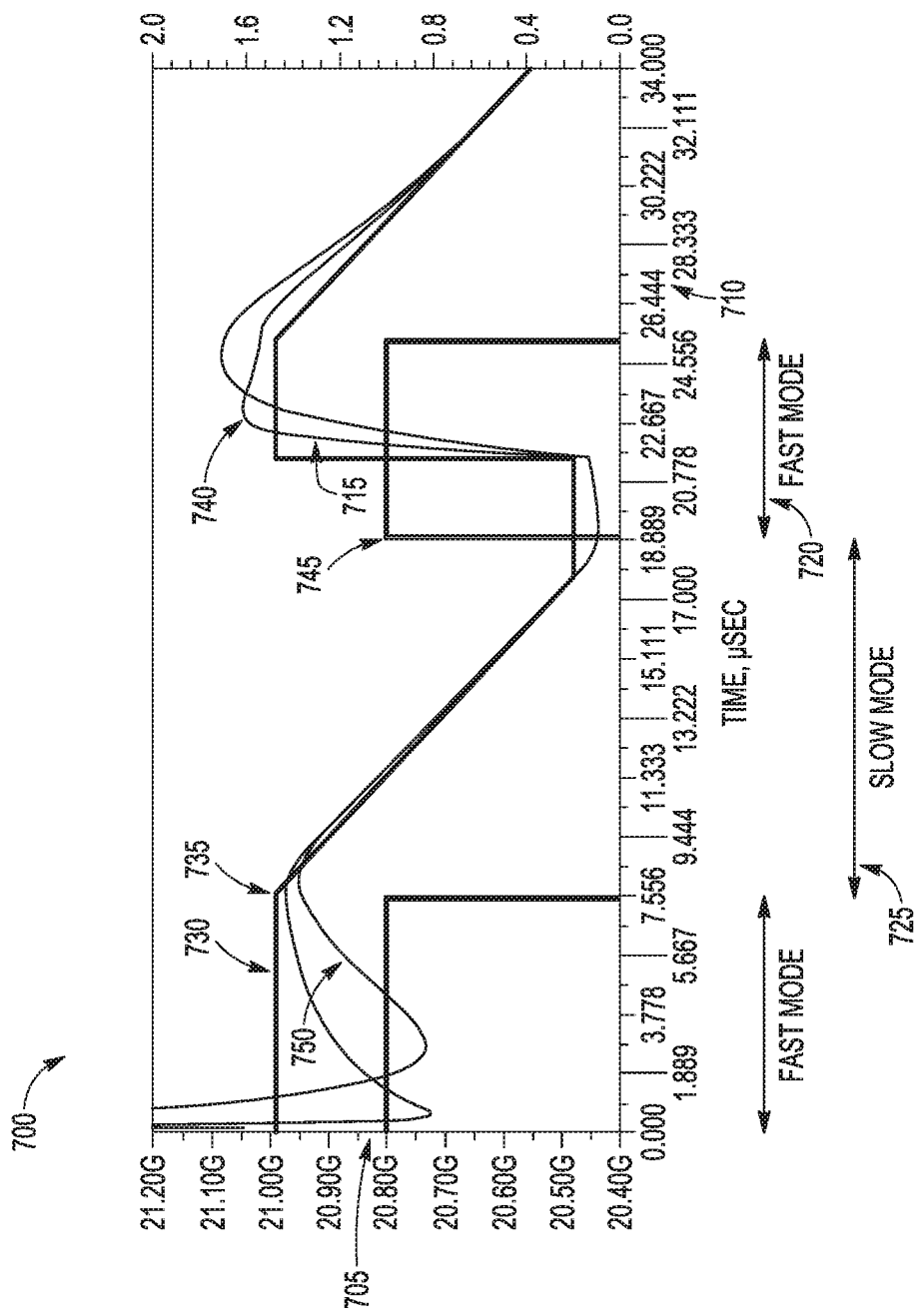
FIG. 7 illustrates an example of a measured ramp waveform with a reset period, with and without implementing a gear shifting circuit.

FIG. 7 illustrates an example of measured ramp waveforms 700, of frequency 705 versus time 710. The waveforms 700 include a reset period 715, and illustrate waveforms of DCO performance with and without implementing a gear shifting circuit in examples of the invention. A first waveform 750 shows a performance of a known DCO circuit, namely with no gear shift circuit according to examples of the invention. A second waveform 740 shows a performance of a DCO circuit, with a gear shift circuit according to examples of the invention. Timing point 735 in the waveforms indicates the point that the gear shift circuit transitions from a fast mode to a slow mode, and timing point 745 in the waveforms indicates the point that the gear shift circuit transitions from a slow mode to a fast mode, as described in the operation of FIG. 6, for example. In A comparison with an ideal frequency response waveform 730 is also shown. As shown, the reset period 715 when employing the gear shift circuit, within a fast operational mode 720 according to examples of the invention is notably faster than the comparable reset period when the example gear shift circuit is not employed.

The measured ramp waveforms 700 of FIG. 7 illustrate that the important parameters are: (i) how long it takes for the real frequency to matching the ideal frequency; and (ii) how far the maximum frequency goes during overshoot, compared to a desired maximum frequency. With regard to this second parameter, the smaller the overshoot the more chance of avoiding transmitting in forbidden frequency bands.

Although FIG. 7 illustrates a ramp down operation, example embodiments of the present invention work equally well with a ramp up operation, where the waveform is a mirror image of the FIG. 7 waveform around a central horizontal axis.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented that achieve the same functionality.

Any arrangement of components to achieve the same functionality is effectively 'associated', such that the desired functionality is achieved. Hence, any two components herein combined to achieve a particular functionality can be seen as being 'associated with' each other, such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations are merely illustrative. The multiple operations may be executed at least partially overlapping in time. Moreover, alternative example embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in wireless programmable devices or units able to perform the desired device functions by operating in accordance with suitable program code.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements.

The mere fact that certain measures are recited in mutually different claims does not indicate that a combination of these measures cannot be used to advantage.

The invention claimed is:

1. A digital synthesizer comprising:
    a ramp generator configured to generate a signal of frequency control words, FCW, that describes a desired frequency modulated continuous wave;
    a digitally controlled oscillator, DCO configured to receive the FCW signal;

a feedback loop; and a phase comparator coupled to the ramp generator and configured to compare a phase of the FCW output from the ramp generator and a signal fed back from the DCO via the feedback loop and output a N-bit oscillator control signal;

wherein the digital synthesizer comprises a gain circuit coupled to a multiplier located between the ramp generator and the DCO and configured to:

apply at least one gain from a plurality of selectable gains to the N-bit oscillator control signal that set a selectable loop gain of the digital synthesizer and thereby set a selectable loop bandwidth;

calculate and apply a first gain offset dependent upon the selected gain that is adapted when the selected gain is changed during a transition from high bandwidth to low bandwidth operation; and calculate and apply a second gain offset dependent upon the selected gain that is adapted when the selected gain is changed during a transition from low bandwidth to high bandwidth operation, and wherein the ramp generator is configured to provide a gain selector signal to the gain circuit to select the at least one gain from the plurality of selectable gains.

2. The digital synthesizer of claim 1, wherein the first and second gain offsets added to the gain-adjusted N-bit oscillator control signal are based on a previously added offset.

3. The digital synthesizer of claim 2, wherein the first and second gain offsets added to the gain-adjusted N-bit oscillator control signal are updated on each successive ramp-up or ramp down signal generated by the ramp generator.

4. The digital synthesizer of claim 1, wherein the plurality of selectable gains comprises a first gain that sets a first loop gain causing a first loop bandwidth, and a second gain that sets a second loop gain causing a second loop bandwidth that is a higher loop bandwidth than that caused by the first gain.

5. The digital synthesizer of claim 1, wherein the ramp generator is configured to provide a gain selector signal to the gain circuit to select the at least one gain from the plurality of selectable gains during a ramp reset period.

6. The digital synthesizer of claim 1 wherein the gain circuit is located within a gear shifting circuit.

7. The digital synthesizer of claim 1, wherein the gain circuit is located within a loop filter located between the ramp generator and DCO and configured to impart a filter frequency response to the N-bit oscillator control signal, wherein the filter frequency response is adapted in conjunction with the selectable gain.

8. The digital synthesizer of claim 7, wherein the gain circuit is configured to effect a loop gain change by adapting a proportional part operation of the loop filter.

9. The digital synthesizer of claim 1, wherein the gain circuit applies the selected gain dynamically during a generation of frequency modulated continuous wave radar ramp-up or ramp-down signal when the PLL is locked.

10. The digital synthesizer of claim 1, wherein a second gain of the gain circuit is selected during a frequency reset of the digital synthesizer.

11. The digital synthesizer of claim 1, wherein first and second gains of the gain circuit are selected and switched to support an increasing or a decreasing frequency of the digital synthesizer.

12. A communication unit having a digital synthesizer comprising:

a ramp generator configured to generate a signal of frequency control words, FCW, that describes a desired frequency modulated continuous wave;

a digitally controlled oscillator, DCO configured to receive the FCW signal;

a feedback loop; and a phase comparator coupled to the ramp generator and configured to compare a phase of the FCW output from the ramp generator and a signal fed back from the DCO via the feedback loop and output a N-bit oscillator control signal;

wherein the digital synthesizer comprises a gain circuit coupled to a multiplier located between the ramp generator and the DCO and configured to:

apply at least one gain from a plurality of selectable gains to the N-bit oscillator control signal that sets a selectable loop gain of the digital synthesizer and thereby set a selectable loop bandwidth; and calculate and apply a first gain offset dependent upon the selected gain that is adapted when the selected gain is changed during a transition from high bandwidth to low bandwidth operation;

calculate and apply a second gain offset dependent upon the selected gain that is adapted when the selected gain is changed during a transition from low bandwidth to high bandwidth operation, and wherein the ramp generator is configured to provide a gain selector signal to the gain circuit to select the at least one gain from the plurality of selectable gains.

13. The communication unit of claim 12, wherein the first and second gain offsets added to the gain-adjusted N-bit oscillator control signal are based on a previously added offset.

14. The communication unit of claim 13, wherein the first and second gain offsets added to the gain-adjusted N-bit oscillator control signal are updated on each successive ramp-up or ramp down signal generated by the ramp generator.

15. The communication unit of claim 12, wherein the plurality of selectable gains comprises a first gain that sets a first loop gain causing a first loop bandwidth, and a second gain that sets a second loop gain causing a second loop bandwidth that is a higher loop bandwidth than that caused by the first gain.

16. The communication unit of claim 12, wherein the ramp generator is configured to provide a gain selector signal to the gain circuit to select the at least one gain from the plurality of selectable gains during a ramp reset period.

17. The communication unit of claim 12, wherein the gain circuit is located within a loop filter located between the ramp generator and DCO and configured to impart a filter frequency response to the N-bit oscillator control signal, wherein the filter frequency response is adapted in conjunction with the selectable gain.

18. A method for maintaining an open loop gain of a digitally controlled oscillator, DCO, feedback loop as substantially constant, the method comprising:

generating a signal of frequency control words, FCW, that describes a desired frequency modulated continuous wave, wherein the generating is performed by a ramp generator;

comparing a phase of the FCW signal with a signal fed back from an output of the DCO at a phase comparator and outputting a N-bit oscillator control signal from the phase comparator;

selecting at least one gain from a plurality of selectable gains, wherein the at least one gain is selected based on a gain selector signal received from the ramp generator;

applying the selected at least one gain from a plurality of selectable gains to the N-bit oscillator control signal to set a selectable loop gain of the digital synthesizer and thereby set a selectable loop bandwidth; and calculating and applying a first gain offset dependent upon the selected gain that is adapted when the selected gain is changed during a transition from high bandwidth to low bandwidth operation;

calculating and applying a second gain offset dependent upon the selected gain that is adapted when the selected gain is changed during a transition from low bandwidth to high bandwidth operation.

* * * * *